US010320417B2

(12) United States Patent
Wang

(10) Patent No.: US 10,320,417 B2
(45) Date of Patent: Jun. 11, 2019

(54) DECODING METHOD AND RELATED APPARATUS

(71) Applicant: Silicon Motion Inc., Hsinchu County (TW)

(72) Inventor: Yu-Luen Wang, Hsinchu (TW)

(73) Assignee: Silicon Motion Inc., Hsinchu County (TW)

( * ) Notice: Subject to any disclaimer, the term of this patent is extended or adjusted under 35 U.S.C. 154(b) by 8 days.

(21) Appl. No.: 15/654,710

(22) Filed: Jul. 20, 2017

(65) Prior Publication Data

US 2018/0191376 A1 Jul. 5, 2018

(30) Foreign Application Priority Data

Dec. 30, 2016 (TW) .............................. 105144125 A

(51) Int. Cl.
| | | |
|---|---|---|
| *H03M 13/00* | (2006.01) | |
| *H03M 13/11* | (2006.01) | |
| *H04L 1/00* | (2006.01) | |
| *H03M 13/15* | (2006.01) | |

(52) U.S. Cl.
CPC .... *H03M 13/1108* (2013.01); *H03M 13/1128* (2013.01); *H03M 13/159* (2013.01); *H04L 1/0021* (2013.01)

(58) Field of Classification Search
CPC ......... H03M 13/1108; H03M 13/1128; H03M 13/159; H04L 1/0021
See application file for complete search history.

(56) References Cited

U.S. PATENT DOCUMENTS

| | | | | |
|---|---|---|---|---|
| 7,805,386 | B2* | 9/2010 | Greer | ....................... G06N 3/04 382/158 |
| 7,904,793 | B2 | 3/2011 | Mokhlesi | |
| 7,916,605 | B2* | 3/2011 | Ross | ................ G11B 20/10009 369/47.1 |
| 8,055,975 | B2* | 11/2011 | Lilly | ..................... H03M 13/09 714/758 |
| 8,448,039 | B2* | 5/2013 | Gunnam | ............ H03M 13/1111 714/752 |
| 8,484,535 | B2* | 7/2013 | Graef | .................. G06F 11/1012 714/752 |
| 9,214,942 | B2* | 12/2015 | Thakur | .............. H03K 19/0948 |
| 9,531,406 | B2* | 12/2016 | Eleftheriou | ........ H03M 13/1108 |
| 9,563,502 | B1* | 2/2017 | Alhussien | ........... G06F 11/1048 |
| 2015/0052413 | A1 | 2/2015 | Eleftheriou | |
| 2016/0335160 | A1 | 11/2016 | Zhang | |

FOREIGN PATENT DOCUMENTS

| | | |
|---|---|---|
| CN | 102893529 B | 3/2016 |
| CN | 103888148 B | 10/2016 |
| CN | 106160753 A | 11/2016 |
| TW | 201510717 A | 3/2015 |

* cited by examiner

*Primary Examiner* — Esaw T Abraham
(74) *Attorney, Agent, or Firm* — Winston Hsu

(57) ABSTRACT

A method of decoding a received message includes: determining a weighting vector corresponding to at least one bit of the received message according to a syndrome and a parity check matrix; determining a bit state of the bit according to a bit value of the bit; changing the bit state according to the weighting vector and a flipping threshold, wherein a change range of the bit state is variable; and flipping the bit according to the bit state.

7 Claims, 10 Drawing Sheets $W_k \leq TH_{low}$

US 10,320,417 B2

DECODING METHOD AND RELATED APPARATUS

BACKGROUND OF THE INVENTION

1. Field of the Invention

The present invention relates to error correction, and more particularly, to a decoding method and related apparatus for error correction.

2. Description of the Prior Art

In a data/information communication system of FIG. 1, in order to implement error correction, original message m at a transmitting terminal is encoded by an encoder 11, which adds a parity check code p of a certain number of bits to the original message m, thereby to forma codeword c. The codeword c will be transmitted through a channel 30, and a receiving terminal 2 can obtain a received message r through the channel 30. A decoder 21 at the receiving terminal 2 determines whether the received message r includes errors caused by channel noise according to encoding algorithm performed by the encoder 11. Once the errors are found, the decoder 21 performs corresponding algorithm to conduct error correction, thereby to recover the codeword c and extract the original message m from the recovered codeword c. Although there exist many excellent decoding algorithms and related circuits in the state of art, these decoding algorithms and related circuits still can be further improved.

SUMMARY OF THE INVENTION

According to one embodiment, a decoding method of decoding a received message is provided. The decoding method comprises: determining a weighting vector corresponding to at least one bit of the received message according to a syndrome and a parity check matrix; determining a bit state of the bit according to a bit value of the bit; changing the bit state according to the weighting vector and a flipping threshold, wherein a change range of the bit state is variable; and flipping the bit according to the bit state.

According to one embodiment, a decoding apparatus of decoding a received message is provided. The decoding apparatus comprises: a weighting calculation unit, a state determination unit, a flipping calculation unit and a flipping processing unit. The weighting calculation unit is arranged for determining a weighting vector corresponding to at least one bit of the received message according to a syndrome and a parity check matrix. The state determination unit is arranged for determining a bit state of the bit according to a bit value of the bit. The flipping calculation unit is arranged for generating a bit flipping vector for changing the bit state according to the weighting vector and a flipping threshold, wherein a change range of the bit state is variable. The flipping processing unit is arranged for changing the bit state of the bit and flipping the bit according to the bit state.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

The decoding method and apparatus provided by the present invention can be used in a receiving terminal of an information transmission system and arranged for decoding a codeword transmitted from a transmitting terminal of the information transmission system.

After processed by an encoder at the transmitting terminal, parity check code p of a certain number of bits is added to an original message m to form a codeword c. For example, in Low-density parity-check code (LDPC code) architecture, the encoder generates the codeword c according to a generation matrix G by:

$$m \cdot G = c$$

wherein the relationship between a parity check matrix H and the generation matrix G is:

$$G \cdot H^T = 0$$

Additionally, the relationship between the parity check matrix H and the codeword c is:

$$c \cdot H^T = 0$$

Assume that the codeword c is transmitted over the channel and the receiving terminal accordingly receives a received message r, the received message r can be represented as a summation of the codeword c and the error e, where the error could be the interference caused by channel noise:

$$r = c + e$$

Then, calculating the dot product of the received message r and the transpose of the parity check matrix H, it can be obtained that:

$$r \cdot H^T = (c+e) \cdot H^T = c \cdot H^T + e \cdot H^T$$

As $c \cdot H^T$ must be zero, the above-mentioned dot product will be $e \cdot H^T$, which is also called a syndrome. If the received message r does not include any errors, the syndrome will be zero. However, even if the syndrome is not equal to zero initially, the result of "$r' \cdot H^T = 0$" could be obtained by repeatedly correcting a portion of bits of the received message r (r' is a corrected version of the received message r). Once the result "r'·H$^T$=0" is obtained, this means the corrected received message r' is consistent with the codeword c sent by the transmitting terminal.

Figure 1:
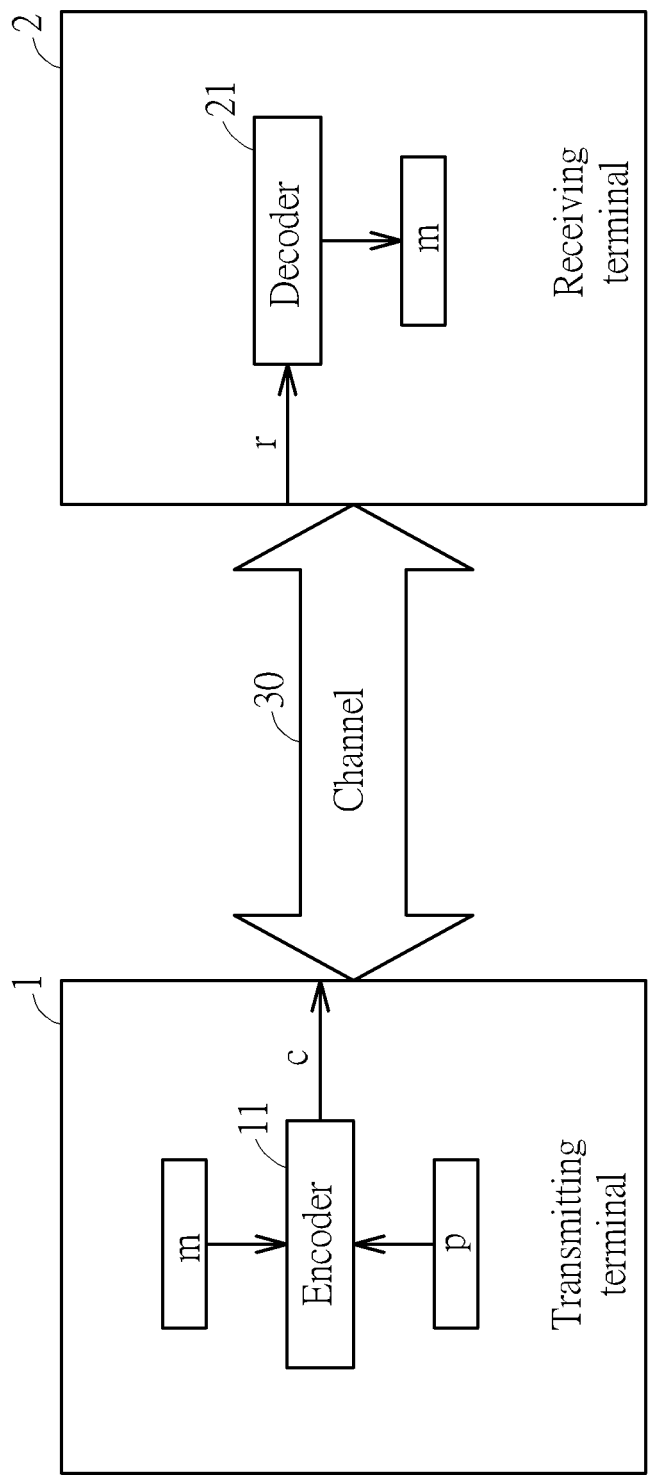
FIG. 1 is a diagram illustrating data encoding/decoding and data transmission.
Figure 2:
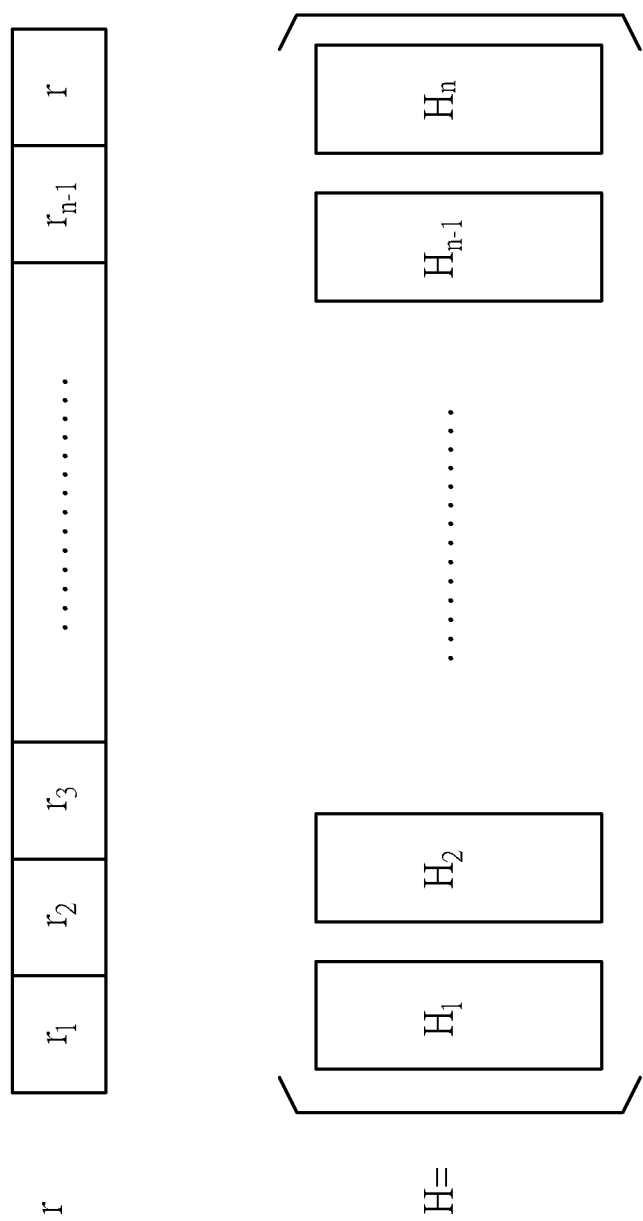
FIG. 2 is a diagram illustrating segment and division of a received message and a parity check matrix.

As illustrated by FIG. 2, the received terminal r can be represented as n received message blocks $r_1$-$r_n$. Each of the received message blocks $r_1$-$r_n$ may comprises one or more bits. Similarly, the parity check matrix H can be also divided into n corresponding sub-matrices $H_1$-$H_n$ in a same manner.

Figure 3:
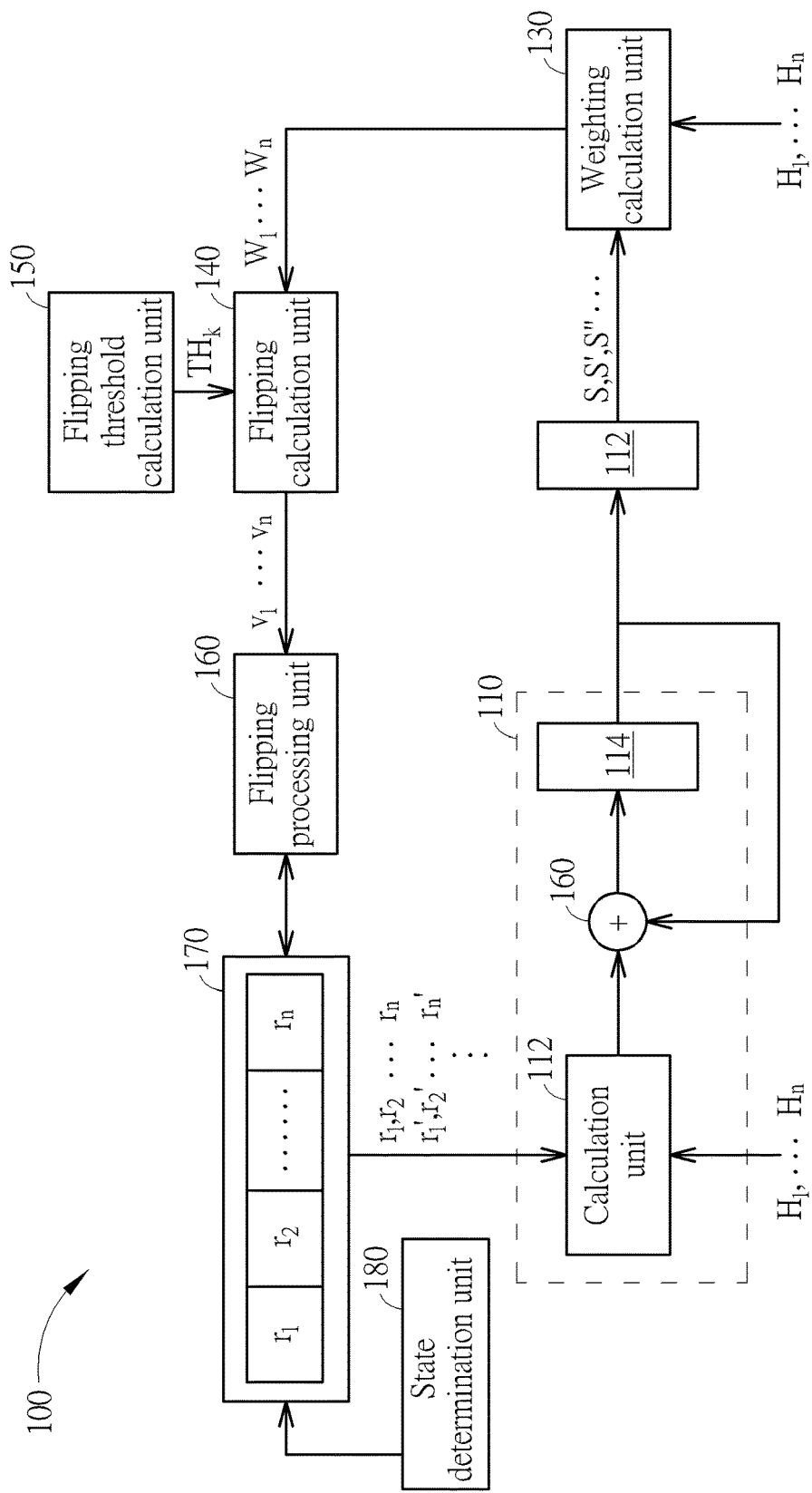
FIG. 3 is a block diagram illustrates a decoding apparatus according to one embodiment of the present invention.

FIG. 3 illustrates a decoding apparatus 100 according to one embodiment of the present invention. The decoding apparatus 100 decodes the received message r by iterative calculation. r. In an iteration, a calculation unit 112 in a syndrome calculation unit 110 will calculate each dot product of the received messages $r_1$-$r_n$ and the transposes $H_1^T$-$H_n^T$ of the corresponding sub-matrices $H_1$-$H_n$, i.e., $r_1 \cdot H_1^T, r_2 \cdot H_2^T, r_3 \cdot H_3^T, \ldots$ and $r_n \cdot H_n^T$. Each time the calculation unit 112 figures out a dot product $r_k \cdot H_k^T$, it will be accumulated in a storage unit 114 of the syndrome calculation unit 110. Through an adder 116, the dot product $r_k \cdot H_k^T$ will be added to a next dot product $r_{k+1} \cdot H_{k+1}^T$, and the result will be again written into the storage unit 114. When all the dot products of the received message blocks $r_1$-$r_n$ and the transposes of the parity check matrices $H_1^T$-$H_n^T$ are calculated, the syndrome S can be obtained, which can be further expressed as:

$$r_1 \cdot H_1^T \oplus r_2 \cdot H_2^T \oplus r_3 \cdot H_3^T \oplus \ldots \oplus r_n \cdot H_n^T = S$$

When an iteration ends, the syndrome S calculated by the syndrome calculation unit 110 will be written to another storage unit 120. In a following iteration, the storage unit 120 will remain the stored syndrome S unchanged without being affected by the storage unit 114. The weighting calculation unit 130 calculates multiple sets of weighting vectors according to the syndrome S stored in the storage unit 120. The weighting calculation unit 130 calculates dot products of the syndrome S and each sub-matrices $H_1$-$H_n$, so as to obtain weighting vectors $W_1 = \Sigma S \cdot H_1$, $W_2 = \Sigma S \cdot H_2, \ldots$. And $W_n = \Sigma S \cdot H_n$. Accordingly, the flipping calculation unit 140 performs error correction by producing bit flipping vectors $v_1$-$v_n$ with respect to the received message blocks $r_1$-$r_n$ according to the weighting vectors $W_1, W_2, \ldots$ and $W_n$ and the flipping threshold THk set by the flipping threshold adjustment unit 150.

At first, the flipping threshold adjustment unit 150 sets the flipping threshold $TH_k$ as $TH_1$ (which is typically a maximum value of all the possible thresholds and also the number of "1"s in one column of the parity check matrix H). Then, the flipping calculation unit 140 check each of the weighting vectors $W_1, W_2, \ldots$ and $W_n$ according to the current flipping threshold $TH_1$, so as to determine whether any element in the weighting vectors $W_1, W_2, \ldots$ and $W_n$ is equal to or greater than the current flipping threshold $TH_1$, thereby producing the bit flipping vectors $v_1$-$v_n$. For example, if the flipping calculation unit 140 finds one or more elements in the weighting vectors $W_2$ is greater than or equal to the flipping threshold $TH_1$ when checking the weighting vectors $W_2$, the flipping calculation unit 140 produces a bit flipping vector $v_2$ with respect to the received message blocks $r_2$. The bit flipping vector $v_2$ indicates one or more bits in the received message block $r_2$ that corresponds to the one or the more elements needs to be flipped (which represents the one or more bits may be wrong), such as, flipping the bit value "1" as the bit value "0" or flipping the bit value "0" as the bit value "1". On the other hand, if the flipping calculation unit 140 does not detect any element in the weighting vectors $W_1, W_2, \ldots$ and $W_n$ is greater than or equal to the current flipping threshold $TH_1$, it produces zero bit flipping vectors $v_1$-$v_n$, which does not flip any bit. Furthermore, the flipping processing unit 160 updates the stored received message blocks $r_1$-$r_n$ in the storage unit 170 according to the bit flipping vectors $v_1$-$v_n$, thereby obtaining the processed received message blocks $r_1'$-$r_n'$.

In one iteration, the flipping calculation unit 140 checks each of the weighting vectors $W_1, W_2 \ldots$ and $W_n$ and produces the bit flipping vectors $v_1$-$v_n$ according to checking results. After all the weighting vectors $W_1, W_2, \ldots$ and $W_n$ have been checked, the iteration ends. In one iteration, if the flipping calculation unit 140 does not find out any element in the weighting vectors $W_1 W_2 \ldots$ and $W_n$ is greater than or equal to the current flipping threshold $TH_1$, the flipping calculation unit 140 asks the flipping threshold adjustment unit 150 to decrease the current flipping threshold to be $TH_2$. In a following iteration, the flipping calculation unit 140 again checks each of the weighting vectors $W_1, W_2 \ldots$ and $W_n$ according to the current flipping threshold $TH_2$, and determines whether to flipping one or more bits of any of the received message blocks $r_1$-$r_k$, thereby to produce bit flipping vectors $v_1$-$v_n$.

On the other hand, once the flipping calculation unit 140 generates a non-zero flipping vector that can caused one or more bits of any of the received message blocks $r_1$-$r_n$ flipped, the flipping processing unit 160 will update the received message stored in the storage unit 170 to obtain the processed received message blocks $r_1'$-$r_n'$ at the end of the iteration. In a following iteration, the syndrome calculation unit 110 re-calculates the syndrome to obtain the syndrome S' according to the processed received message blocks $r_1'$-$r_n'$. Then, the weighting calculation unit 130 calculates the weighing according to the syndrome S' and the parity check matrix H($H_1$-$H_n$) to obtain new n weighting vectors $W_1'$, $W_2', \ldots$ and $W_n'$. After obtaining the new n weighting vectors $W_1^1, W_2', \ldots$ and $W_n'$, the flipping calculation unit 140 again checks the weighting vectors $W_1', W_2', \ldots$ and $W_n'$ according to the flipping threshold TH1. Please note that once the flipping calculation unit 140 have flipped one or more bits in the received message blocks $r_1$-$r_k$ the flipping threshold will be reset to a maximum one (e.g. $TH_1$) in a following iteration. Only when the flipping calculation unit 140 does not find any element in the weighting vectors $W_1, W_2, \ldots$ and $W_n$ is greater than or equal to the current flipping threshold, the current flipping threshold will be decreased (e.g. from TH1 to $TH_2$). The decoding apparatus 100 repeats the above-mentioned iteration until the syndrome of 0 is obtained. When the syndrome is equal to 0, this means the processed received message does not include any error and is consistent with the codeword c at the transmitting terminal. Thus, the error correction procedure for the received message is finished. Alternatively, if the number of iterations reaches an upper limit, this means errors in the received message r cannot be corrected. Thus, the error correction procedure is also finished, but the received message r is deemed as invalid.

Figure 4:
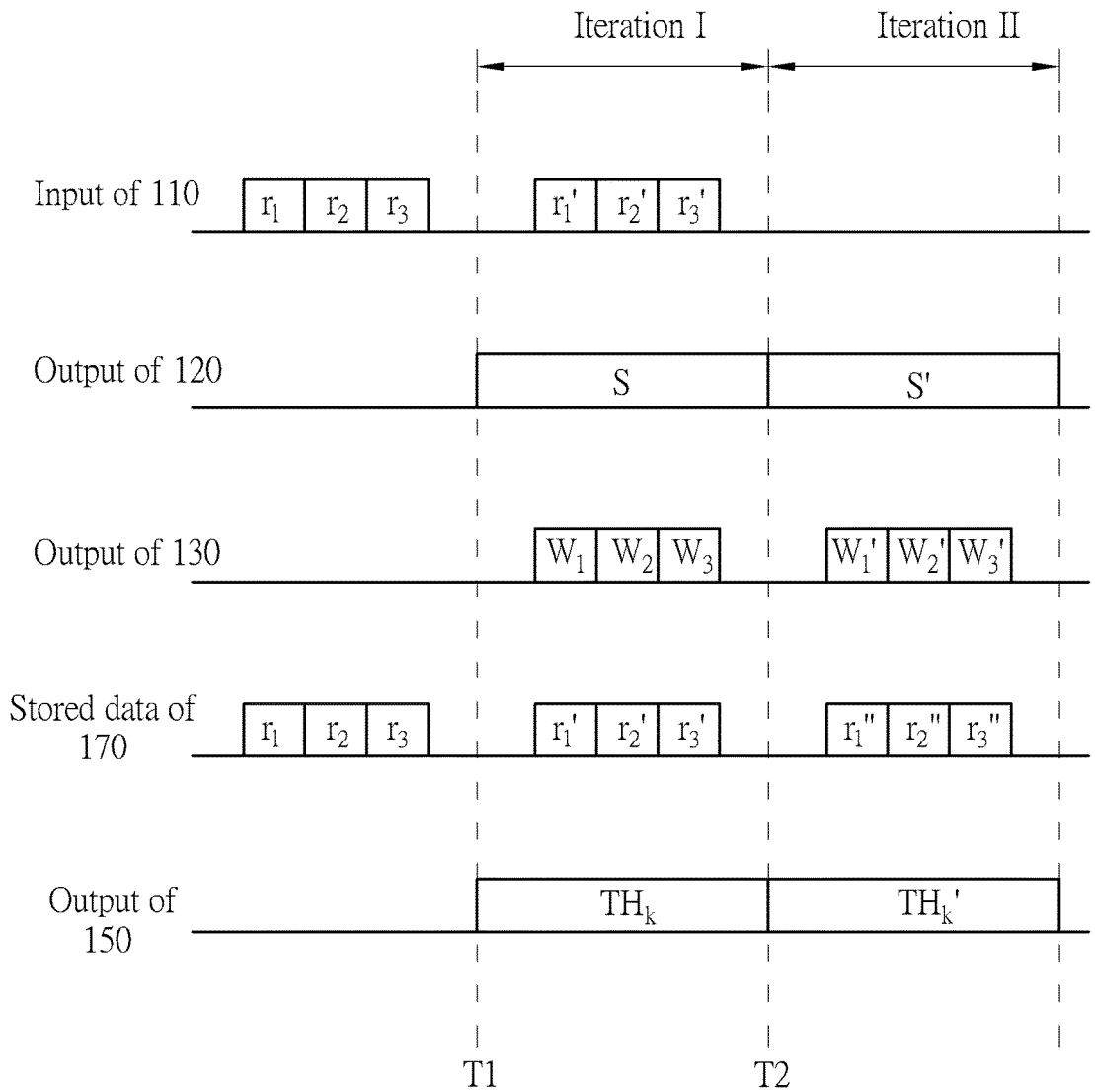
FIG. 4 is a timing chart regarding signals in the decoding apparatus shown in FIG. 3.

FIG. 4 illustrates a timing chart of the first few iterations of the above-mentioned error correction procedure. For sake of simplicity, the received message r now includes three received message blocks $r_1$, $r_2$ and $r_3$ only. At time T1, the syndrome calculation unit 110 receives the received message r including the received message blocks $r_1$, $r_2$ and $r_3$. Accordingly, the syndrome S is obtained in the iteration I. In the iteration I, the weighting calculation unit 130 calculates the weighting vectors $W_1$, $W_2$ and $W_3$ based on the syndrome S. In the meantime, each time the weighting calculation unit 130 calculates a weighting vector, the flipping calculation unit 140 checks the weighting vectors $W_1$, $W_2$ and $W_3$ according to the current flipping threshold $TH_1$. According to checking results, it is determined whether to flip one or more bits of the received message blocks $r_1$, $r_2$ and $r_3$. Afterward, the processed received message r' and related received message blocks $r_1'$, $r_2'$ and $r_3'$ are obtained. In the iteration II, the syndrome calculation unit 110 refers to the processed received message blocks $r_1'$, $r_2'$ and $r_3'$ for syndrome calculation and obtain new syndrome S'.

As can be seen from the timing chart, there is a delay between the updating of the syndrome and the determination of the bit flipping. For example, even though the processed received message block $r_1'$ is obtained at the early stage of the iteration I, the processed received message block $r_1'$ actually affects the syndrome and the syndrome S is updated as the syndrome S' until the iteration II. Another problem is that no matter whether all the received message blocks $r_1$, $r_2$ and $r_3$ are updated in an iteration, the syndrome calculation unit 110 needs to load and refer to all the received message blocks $r_1$, $r_2$ and $r_3$ in the storage unit 170 to re-calculate the syndrome, which leads to unnecessary power consumption. In view of this, the present invention provides another decoding architecture to address such problem.

Figure 5:
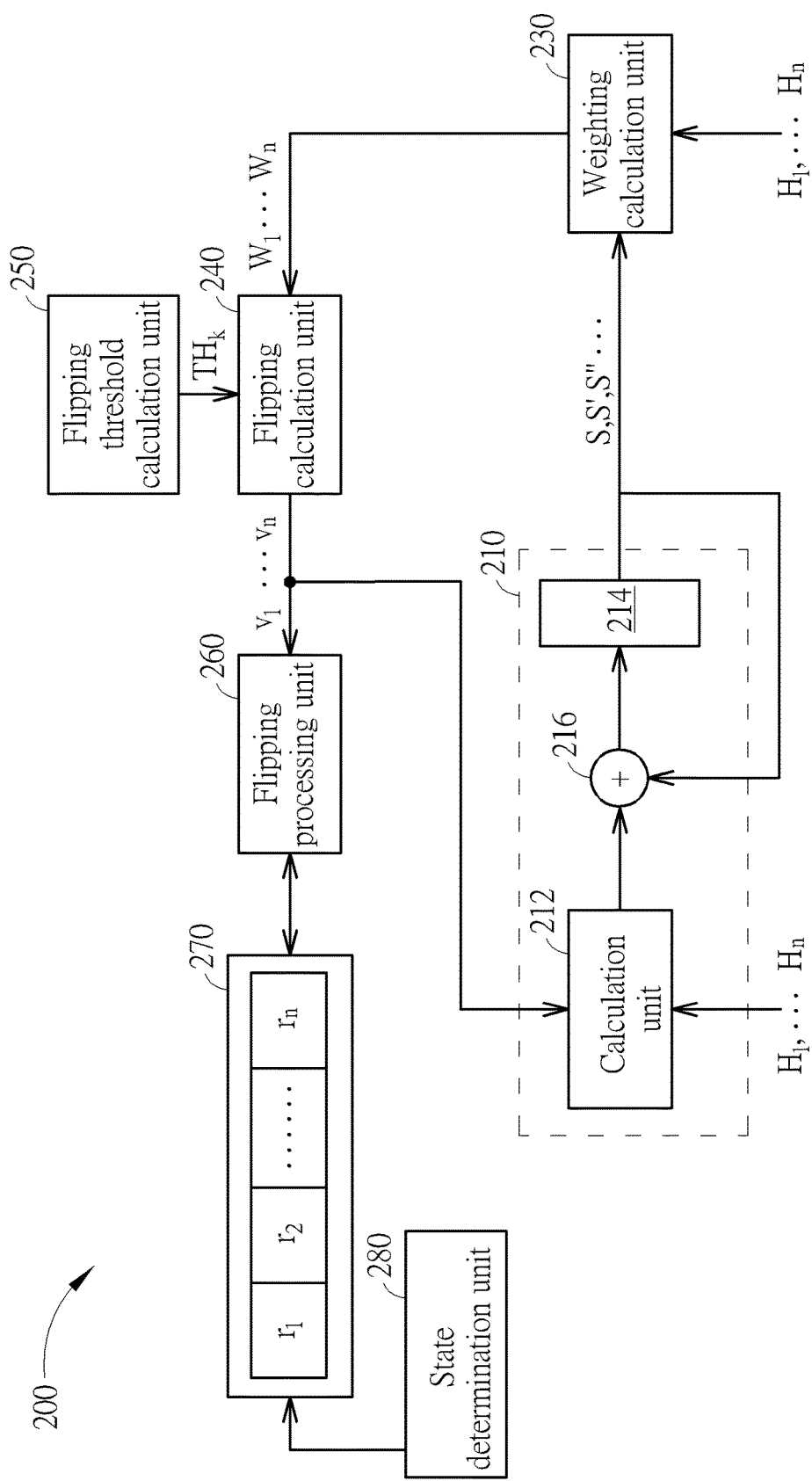
FIG. 5 is a block diagram illustrates a decoding apparatus according to another embodiment of the present invention.
Figure 6:
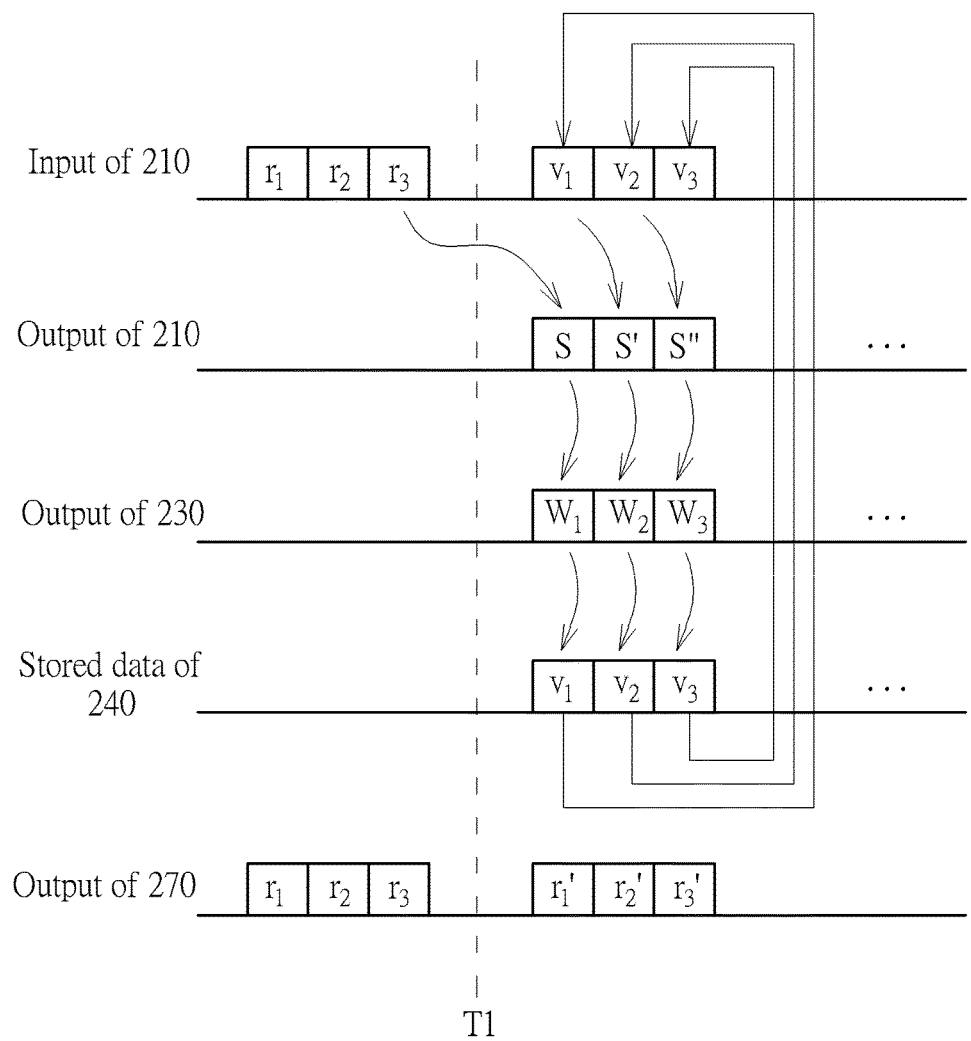
FIG. 6 is a timing chart regarding signals in the decoding apparatus shown in FIG. 5.

FIG. 5 illustrates a block diagram of a decoding apparatus according to one embodiment of the present invention, which improves the delay of updating and power consumption. In this embodiment, syndrome calculation unit 210, weighting calculation unit 230, flipping calculation unit 240, flipping processing unit 260 and storage unit 270 are substantially identical to the weighting calculation unit 130, the flipping calculation unit 140, the flipping processing unit 160 and storage unit 170, in principles and operations. The difference between the decoding apparatus 200 and the decoding apparatus 100 is that the decoding apparatus 200 immediately updates the syndrome as long as the bit flipping occurs. Please refer to the block diagram of FIG. 5 in conjunction with a timing chart of FIG. 6. At first after time T1, the syndrome calculation unit 210 calculates the syndrome S according to the received message block $r_1$-$r_3$ (where n=3) in a iterative calculation manner. Accordingly, the weighting calculation unit 230 calculates the weighting vector $W_1$, and the flipping calculation unit 240 determines the bits of the received message block r1 needs to be flipped according to the weighting vector $W_1$ (supposing now the bits needs to be flipped), thereby producing the bit flipping vector $v_1$ corresponding to the received message block $r_1$. At this time, the syndrome calculation unit 210 immediately updates the syndrome S according to the bit flipping vector $v_1$, so as to obtain the syndrome S'. Based on the syndrome S', the flipping calculation unit 240 calculates the weighting vector $W_2'$, and again determines the bits in the received message block $r_2$ needs to be flipped (supposing now the bits needs to be flipped), thereby producing the bit flipping vector $v_2$ corresponding to the received message block $r_2$. Accordingly, the syndrome calculation unit 210 updates the syndrome S' to obtain the syndrome S", such that the bit flipping vector $v_3$ corresponding to the received message block $r_3$ can be produced. On the other hand, at time T1, the received message blocks $r_1$-$r_3$ are stored in the storage unit 270. Afterward, the flipping processing unit 260 updates the received message blocks $r_1$-$r_3$ in the storage unit 270 to be the processed received message blocks $r_1'$-$r_3'$ according to the bit flipping vectors $v_1$-$v_3$.

In this embodiment, the storage unit 120 does not exist. Each time an received message block is processed by bit flipping operation, the change of the syndrome will immediately reflect in processing and updating of a next received message block. Therefore, the efficiency of decoding can be improved. On the other hand, the syndrome calculation unit 210 calculates and updates the syndrome without referring to all the received message blocks. Instead, the syndrome calculation unit 210 calculates and updates the syndrome based on the change of the received message block (i.e., the bit flipping vector). That is, the accumulation result in the storage unit 224 of the syndrome calculation unit 210 is updated by the change of the received message block. Accordingly, power consumption caused by the re-calculating the syndrome in every iteration, as implemented in the previous embodiment, can be saved. As the efficiency of the decoding is improved, the throughput of the decoding apparatus is also improved.

In this embodiment, as the syndrome is continuously updated, it is difficult to define boundaries of each iteration. Hence, adjustment of the flipping threshold is not performed on iteration-by-iteration basis. Therefore, the flipping threshold adjustment unit 250 adjusts the flipping threshold according to whether one or more bits have been flipped within a certain times of checking the weighting vectors $W_1$-$W_n$. For example, if the received message r is divided into n received message blocks $r_1$-$r_n$, the flipping threshold adjustment unit 250 detects whether the flipping calculation unit 240 determines to flip (i.e., produces the non-zero bit flipping vector) one or more bits of a certain one of the received message blocks inn cycles of checking. If there is no any bit flipped during n cycles of checking, the flipping threshold will be decreased. Also, if bit flipping occurs too frequently, the flipping threshold adjustment unit 250 will increase the flipping threshold.

To improve the reliability of the decoding and the error correction, in one embodiment of the present invention, each bit is designed to have at least four different bit states. Each received message block $r_1$-$r_n$ comprises one or more bits. After received, each bit is determined as having either a first bit value (e.g. "1") or a second bit value (e.g. "0"). Then, the four bit states of each bit comprise: strong "1", strong "0", weak "1" and weak "0". The determined bit value "1" will allow a state determination unit 180/280 to determine the bit having the bit state of strong "1", and the determined bit value "0" will allow the state determination unit 180/280 to determine the bit having the bit state of strong "0". The state determination unit 180/280 records the initial bit state of each bit in the storage unit 170/270. The storage unit 170/270 also records change of the bit state of each bit in the following.

In the embodiment, the non-zero bit flipping vector produced by the flipping calculation unit 140/240 will make the state of the bit value to transition to another state, but not necessarily to make the bit value flipped. After the syndrome calculation unit 110/210 calculates the syndrome S and the weighting calculation unit 110/230 calculates weighting vectors $W_1$-$W_n$ according to the syndrome S and the parity check matrix H (i.e., $H_1$~$H_n$), the flipping calculation unit 140/240 produces the bit flipping vectors $v_1$-$v_n$ according to the weighting vectors $W_1$-$W_n$ and the current flipping threshold $TH_k$, the flipping processing unit 160/260 updates a state of one or more bits in the storage unit 170/270 according to the non-zero bit flipping vectors $v_1$-$v_n$. According to the weighting vectors $W_1$-$W_n$ and the flipping threshold $TH_k$, the flipping calculation unit 140/240 produces the bit flipping vector that causes a variable change of the bit state. The bit state of strong "1" can be deemed as the more likely bit value "1", the bit state of strong "0" can be deemed as the more likely bit value "0", the bit state of weak "1" can be deemed as the less likely bit value "1", and the bit state of weak "0" can be deemed as the less likely bit value "0".

Figure 7A:
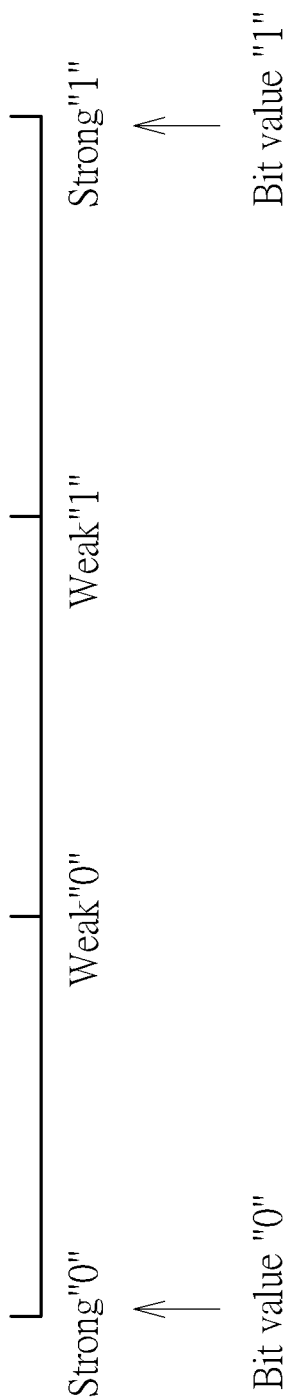
FIGS. 7A-7D illustrate bit states and their transitions according to embodiments of the present invention.

As can be seen from FIG. 7A, the four bit states are a particularly sequenced. When transitioning to a neighbor bit state, it can be deemed as a small change of bit state, and when transitioning to a non-neighboring bit state, it can be deemed as a big change of bit state.

Figure 7B:
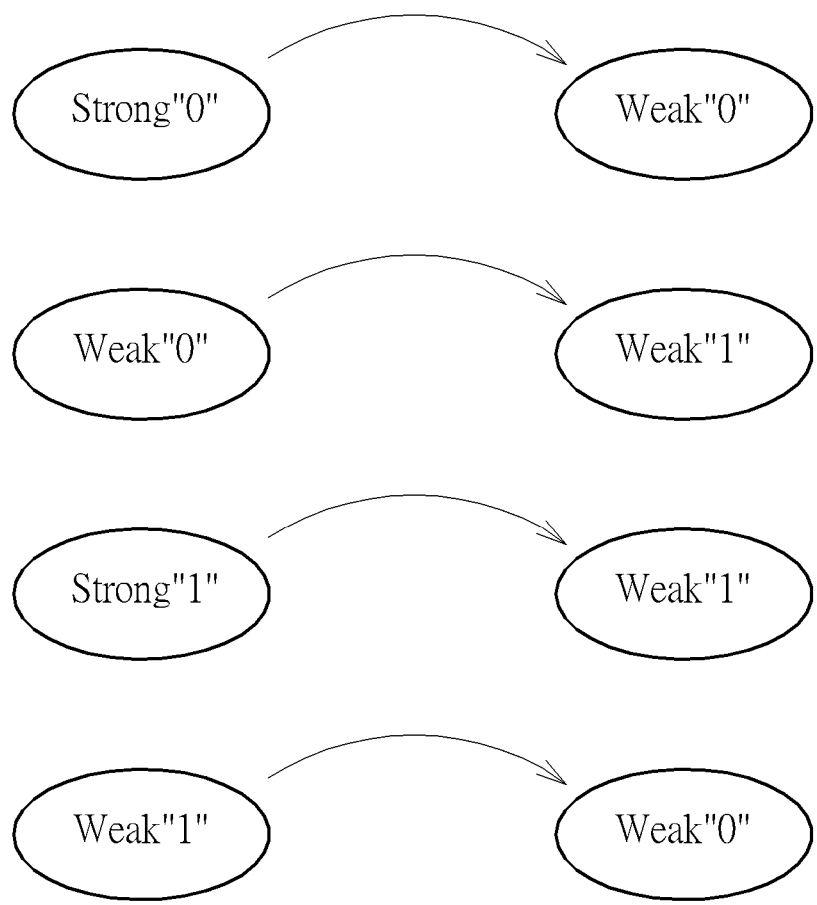

As illustrated by FIG. 7B, if an element $w_k$ of the weighting vector $W_k$ is greater than or equal to the current flipping threshold $TH_k$ and the threshold $TH_k$ is not equal to the maximum flipping threshold $TH_1$, the flipping calculation unit 140/240 will produce a bit flipping vector that can cause the bit state of the bit to have a small change. For example, if the bit state of the bit is strong "0", the produced bit flipping vector will cause the bit state to transition to weak"0". When the bit state of the bit is weak"0", the produced bit flipping vector will cause the bit state to transition to weak"1". When the bit state of the bit is strong "1", the produced bit flipping vector will cause the bit state to transition to weak"1". When the bit state of the bit is weak"1", the produced bit flipping vector will cause the bit state to transition to weak"0".

Figure 7C:
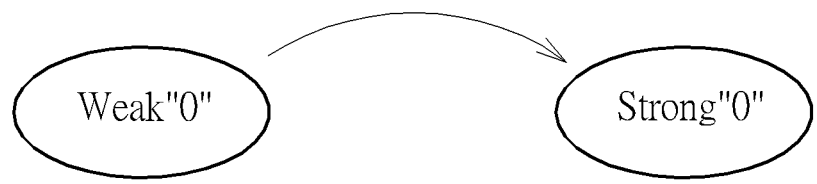
Figure 7C:
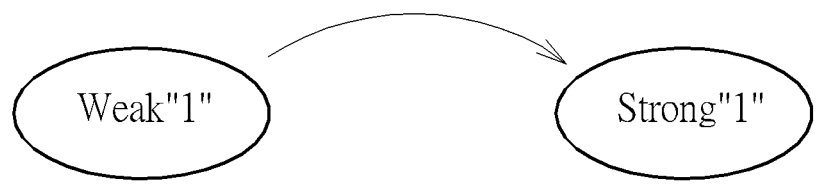

As shown by FIG. 7C, if an element $w_k$ of the weighting vector $W_k$ is smaller than or equal to a non-zero lower limit $TH_{low}$ of the flipping threshold, the flipping calculation unit 140/240 will cause the bit state of the corresponding bit to transition from weak"0" to strong"0", or transition from weak"1" to strong"1".

Figure 7D:
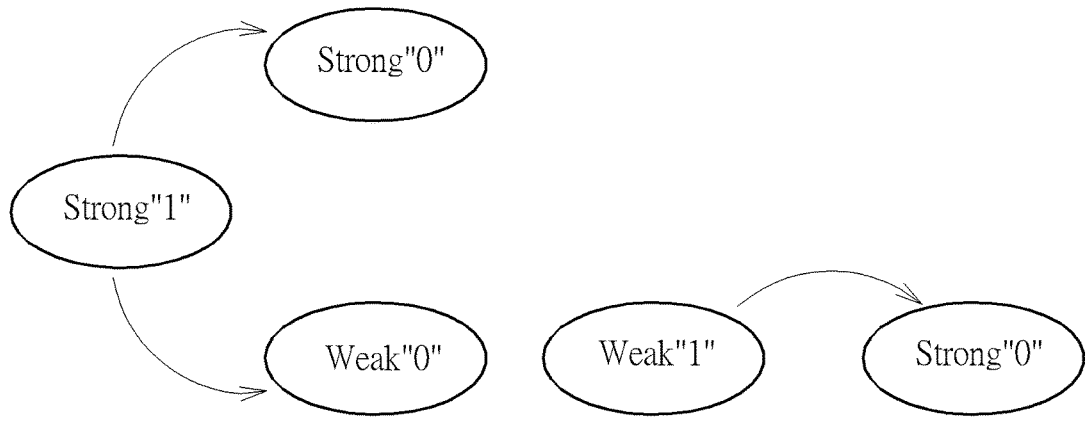
Figure 7D:
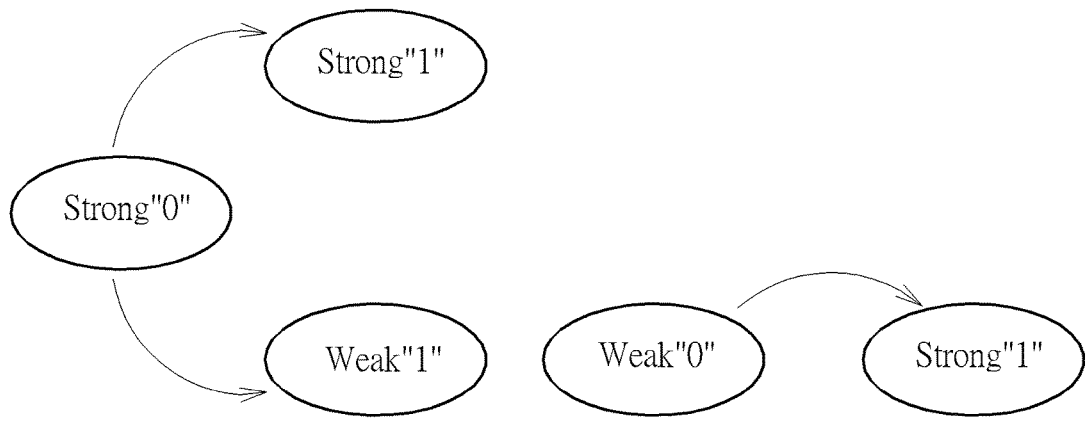

As illustrated by FIG. 7D, if an element $w_k$ of the weighting vectors $W_k$ is equal to the current flipping threshold $TH_k$, and the current flipping threshold $TH_k$ is equal to the maximum. value $TH_1$, the flipping calculation unit 140/240 produces the bit flipping vector that cause a big change to the bit state. For example, if the bit state of the bit is strong "0", the produced bit flipping vector will cause the bit state to transition to weak"1" or strong "1"; if the bit state of the bit is weak"0", the produced bit flipping vector will cause the bit state to transition to strong "1; if the bit state of the bit is strong "1", the produced bit flipping vector will cause the bit state to transition to weak"0" or strong "0"; or if the bit state of the bit is weak"1", the produced bit flipping vector will cause the bit state to transition to strong"0".

From the embodiments illustrated in FIGS. 7B-7D, depending on different elements $w_k$ and flipping threshold $TH_k$, the bit flipping vector will cause the bit state to have changes of different levels. When the element $w_k$ is equal to the current flipping threshold $TH_k$, the flipping calculation unit 140/240 will cause a big change to the bit state because the bit value is more likely to be wrong. The bit state needs to be changed significantly thereby to lead to an actual bit flipping. On the other hand, when the element $w_k$ is greater than or equal to the current flipping threshold $TH_k$ and the flipping threshold $TH_k$ is not equal to the maximum value $TH_1$, this means it is not sure whether the bit value is wrong or not, and need more iterations of calculation to confirm. Hence, the change of the bit state is smaller. When the element $w_k$ is smaller than or equal to a flipping threshold $TH_{low}$ (a lower limit), this means it is less likely to correct the errors in the received message r. Hence, such condition will not substantially change the bit value but allows the bit state to transition to a more conservative state, thereby to avoiding changing a possibly correct value. Through the above-mentioned designs, the reliability of error correction can be improved and the mistaken error correction result caused by improper bit flipping can be avoided.

An embodiment of the invention may include functionality that may be implemented as software executed by a processor, hardware circuits or structures, or a combination of both. The processor may be a general-purpose or dedicated processor, such as a processor from the family of processors made by Intel Corporation, Motorola Incorporated, Sun Microsystems Incorporated and others. The software may comprise programming logic, instructions or data to implement certain functionality for an embodiment of the invention.

The software may be stored in a medium accessible by a machine or computer-readable medium, such as read-only memory (ROM), random-access memory (RAM), magnetic disk (e.g., floppy disk and hard drive), optical disk (e.g., CD-ROM) or any other data storage medium. In one embodiment of the invention, the media may store programming instructions in a compressed and/or encrypted format, as well as instructions that may have to be compiled or installed by an installer before being executed by the processor. Alternatively, an embodiment of the invention may be implemented as specific hardware components that contain hard-wired logic for performing the recited functionality, or by any combination of programmed general-purpose computer components and custom hardware components.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A decoding apparatus of a received message, comprising:
   a weighting calculation unit, arranged for determining a weighting vector corresponding to at least one bit of the received message according to a syndrome and a parity check matrix;
   a state determination unit, arranged for determining a bit state of the bit according to a bit value of the bit;
   a flipping calculation unit, arranged for generating a bit flipping vector for changing the bit state according to the weighting vector and a flipping threshold, wherein a change range of the bit state is variable; and
   a flipping processing unit, arranged for changing the bit state of the bit and flipping the bit according to the bit state.

2. The decoding apparatus of claim 1, wherein the bit state comprises at least one first major state, first minor state, second major state and second minor state, and the state determination unit:
   determines the bit state to be the first major state when the bit value has a first value; and
   determines the bit state to be the second major state when the bit value has a second value.

3. The decoding apparatus of claim 2, when the weighting vector is equal to a maximum value of the flipping threshold, the flipping calculation unit generates a bit flipping vector to cause the bit state to be changed according to a first change range and when the flipping threshold is not equal to the maximum value, the flipping calculation unit generates a bit flipping vector to cause the bit state to be changed according to a second change range, wherein the first change range is wider than the second change range.

4. The decoding apparatus of claim 3, when the weighting vector is equal to a maximum value of the flipping threshold, the flipping calculation unit generates the bit flipping vector to cause the bit state to transition from the first minor state to the second major state, or from the second minor state to the first major state.

5. The decoding apparatus of claim 3, when the weighting vector is equal to a maximum value of the flipping threshold, the flipping calculation unit generates the bit flipping vector to cause the bit state to transition from the first major state to the second major state, or from the second major state to the first major state.

6. The decoding apparatus of claim 3, when the flipping threshold is not equal to the maximum value, and the weighting vector is greater than or equal to the flipping threshold, the flipping calculation unit generates the bit flipping vector to cause the bit state to transition from the first major state to the first minor state, from the first minor state to the second minor state, from the second minor state to the first minor state or from the second major state to the second minor state.

7. The decoding apparatus of claim 3, when the weighting vector is smaller than or equal to a non-zero lower limit of the flipping threshold, the flipping calculation unit generates the bit flipping vector to cause the bit state to transition from the first minor state to the first major state or from the second minor state to the second major state.

* * * * *